(12) United States Patent
Kim et al.

(10) Patent No.: US 8,417,988 B2
(45) Date of Patent: Apr. 9, 2013

(54) MEMORY SYSTEMS AND DEFECTIVE BLOCK MANAGEMENT METHODS RELATED THERETO

(75) Inventors: Yong-June Kim, Seoul (KR); Junjin Kong, Yongin-si (KR); Jaehong Kim, Seoul (KR); Han Woong Yoo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 136 days.

(21) Appl. No.: 12/784,683

(22) Filed: May 21, 2010

(65) Prior Publication Data

US 2010/0306583 A1    Dec. 2, 2010

(30) Foreign Application Priority Data

May 26, 2009 (KR) ................. 10-2009-0045827

(51) Int. Cl.
*G06F 11/26* (2006.01)
*G06F 11/00* (2006.01)

(52) U.S. Cl. ........ 714/6.11; 714/6.1; 714/6.13; 714/6.3; 714/6.32; 714/42; 711/103

(58) Field of Classification Search ............... 714/6.1, 714/6.11, 6.12, 6.13, 6.3, 6.31, 6.32, 30, 714/42, 54; 711/103, 170
See application file for complete search history.

(56) References Cited

U.S. PATENT DOCUMENTS

| | | | |
|---|---|---|---|
| 6,014,755 A * | 1/2000 | Wells et al. | 714/6.13 |
| 6,260,156 B1 * | 7/2001 | Garvin et al. | 714/6.13 |
| 6,601,132 B2 | 7/2003 | Nomura et al. | |
| 7,171,536 B2 | 1/2007 | Chang et al. | |
| 7,464,306 B1 * | 12/2008 | Furuhjelm et al. | 714/710 |
| 7,472,331 B2 * | 12/2008 | Kim | 714/763 |
| 2010/0262868 A1 * | 10/2010 | Galbraith et al. | 714/42 |
| 2010/0281202 A1 * | 11/2010 | Abali et al. | 714/54 |
| 2011/0302445 A1 * | 12/2011 | Byom et al. | 714/6.1 |

FOREIGN PATENT DOCUMENTS

| | | |
|---|---|---|
| JP | 2004-152299 | 5/2004 |
| JP | 2007-328824 | 12/2007 |
| KR | 1020020000062 A | 1/2002 |
| KR | 1020040038713 A | 5/2004 |
| WO | WO 2009032928 A2 * | 3/2009 |

* cited by examiner

*Primary Examiner* — Joseph D Manoskey
(74) *Attorney, Agent, or Firm* — Myers Bigel Sibley & Sajovec

(57) ABSTRACT

Memory systems and related defective block management methods are provided. Methods for managing a defective block in a memory device include allocating a defective block when a memory block satisfies a defective block condition. The allocated defective block is cancelled when the allocated defective block satisfies a defective block cancellation condition.

12 Claims, 10 Drawing Sheets

MEMORY SYSTEMS AND DEFECTIVE BLOCK MANAGEMENT METHODS RELATED THERETO

CLAIM OF PRIORITY

This application claims priority to Korean Patent Application No. 10-2009-0045827, filed May 26, 2009, the contents of which are hereby incorporated herein by reference as if set forth in its entirety.

FIELD

The present invention relates to semiconductor devices and methods of managing the same and, more particularly, to memory systems and defective block management methods related thereto.

BACKGROUND

Recently, the number of devices using non-volatile memories have been increasing. For example, MP3 players, digital cameras, mobile phones, camcorders, flash cards, and Solid State Drives (SSDs) may use non-volatile memories as storage devices. Using non-volatile memories as storage devices may allow the capacity of the non-volatile memories to be significantly increased. Conventional methods for increasing the capacity of a memory exist, for example, methods for storing a plurality of bits in one cell, i.e., a Multi Level Cell (MLC) method.

SUMMARY

Some embodiments of the inventive concept provide methods for managing a defective block in a memory device including: allocating a defective block when a memory block satisfies a defective block condition; and cancelling the allocated defective block when the allocated defective block satisfies a defective block cancellation condition.

In further embodiments, allocating of the defective block may include: determining whether the memory block satisfies the defective block condition; performing a subsequent treatment on the memory block when the memory block satisfies the defective block condition; and allocating the memory block as a defective block. In these embodiments, the subsequent treatment may include programming a cell of an erase state into a cell of a program state, storing a time point when the memory block is allocated as a defective block, or performing a heat treatment on the memory block.

In still further embodiments, the defective block condition may include a frequency of program or delete cycles or whether a delete operation fails.

In some embodiments, the heat treatment may be performed by a heating device of the memory device.

In further embodiments, cancelling of the defective block may include: determining whether the allocated defective block has passed a certain time; determining whether the defective block having passed the certain time satisfies the defective block cancellation condition; and cancelling the allocated defective block when the allocated defective block satisfies the defective block cancellation condition.

In still further embodiments, determining whether the allocated defective block has passed a certain time further includes increasing or reducing a count value corresponding to the allocated defective block whenever a new defective block is allocated.

In some embodiments, the defective block cancellation condition may include whether a program or delete operation is performed on the allocated defective block.

In further embodiments, the method may further include initializing or reducing a frequency of program or delete operations of the corresponding memory block when the allocated defective block is cancelled.

In still further embodiments, the method may further include adjusting number of bits per cell of the corresponding memory block when the allocated defective block is cancelled.

Some embodiments of the inventive concept provide a memory system including a plurality of memory blocks; and a defective block management unit managing a defective block of the plurality of memory blocks, wherein the defective block management unit includes a defective block cancellation unit for cancelling an allocated defective block when the allocated defective block satisfies a defective block cancellation condition.

DETAILED DESCRIPTION OF THE EMBODIMENTS

Figure 1:
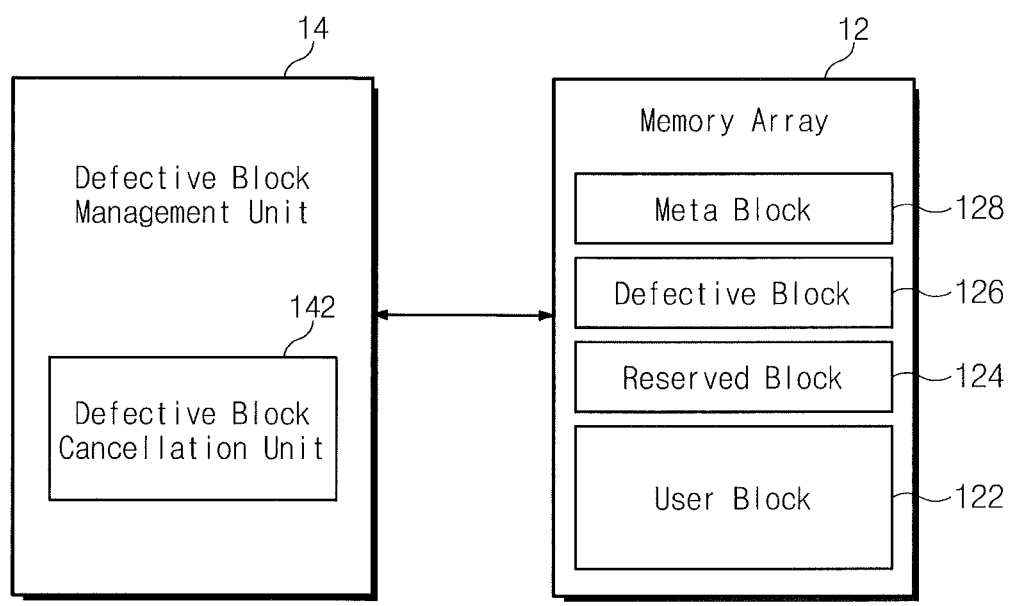
FIG. 1 is a block diagram illustrating a memory system according to some embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third and the like. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will be discussed further below with respect to FIGS. 1 through 10, in memory systems according to embodiments discussed herein an allocated defective block may be cancelled if the allocated defective block satisfies a block cancellation condition. Accordingly, even though the frequency of program/delete cycles may be increased, the efficiency of a memory block in a memory system according to some embodiments may be considerably improved compared to a typical memory system.

Referring first to FIG. 1, a block diagram illustrating a memory system according to some embodiments will be discussed. As illustrated in FIG. 1, a memory system 10 may include a memory array 12 and a defective block management unit 14. The defective block management unit 14 may include a defective block cancellation unit 142 configured to cancel an allocated defective block.

The memory array 12 may include a plurality of memory blocks (not shown). In these embodiments, the plurality of memory blocks may include a user block 122, a reserved block 124, a defective block 126, and a meta block 128. Although it will be assumed that the memory array 12 is an array of flash memories, embodiments of the present invention are not limited to this configuration.

The user block 122 is a space to which data input from the outside is written. Although not shown, in some embodiments, the user block 122 may include a plurality of memory blocks.

The reserved blocks 124 may include a plurality of memory blocks that may be used to replace memory blocks of the user blocks 122 satisfying a defective block condition. Thus, if any memory block of the user block 122 satisfies the defective block condition, one of the reserved blocks 124 may be allocated as a user block to replace the memory block allocated as a defective block.

The defective block 126 may be an unusable memory block. The defective block 126 may be classified into an initial block allocated as a defective block in the manufacturing process and a runtime defective block allocated as a defective block during use. If a memory block satisfies the defective block condition during the operation of the memory system 10, the memory block may be allocated as a defective block. In these embodiments, the frequency of program/delete cycles or whether or not a delete operation fails may be used as the defective block condition.

For example, if the frequency of the delete operation of a memory block exceeds a certain frequency, the corresponding memory block may be allocated as a defective block. Also, if the delete operation of the memory block fails, the corresponding memory block may be allocated as a defective block. The defective block 126 may be allocated as the user block 122 or the reserved block 124 when satisfying a defective block cancellation condition. Details with respect to the defective block cancellation condition will be discussed with reference to FIG. 5.

The meta block 128 may store management information for managing the memory system 10. For example, the management information may include block allocation information on the user block/reserved block/defective block and program/delete cycle frequency information on the respective blocks included in the user block 122. In these embodiments, the block allocation information may include mapping information on physical addresses corresponding to logic addresses.

The defective block management unit 14 may be implemented to allocate or cancel the defective block 126 of the memory array 12. Details with respect to the allocation or cancellation of the defective block will be discussed with reference to FIGS. 3, 5, and 6.

The defective block management unit 14 may include the defective block cancellation unit 142 that is configured to cancel a defective block when the defective block cancellation condition is satisfied. In some embodiments, the defective block cancellation unit 142 may determine whether or not the allocated defective block 126 satisfies the defective block cancellation condition after a certain time has passed, and may perform a defective block cancellation if the defective block cancellation condition is satisfied.

In conventional memory systems, since a memory block that has once been allocated as a defective block is deleted from a usable mapping table, the memory block may not be reused. In memory systems according to some embodiments, even a memory block that has been allocated as a defective block can be reused when the defective block cancellation condition is satisfied. Thus, the memory system 10 shows improved efficiency even though the frequency of program/delete increases in a memory block.

Figure 2:
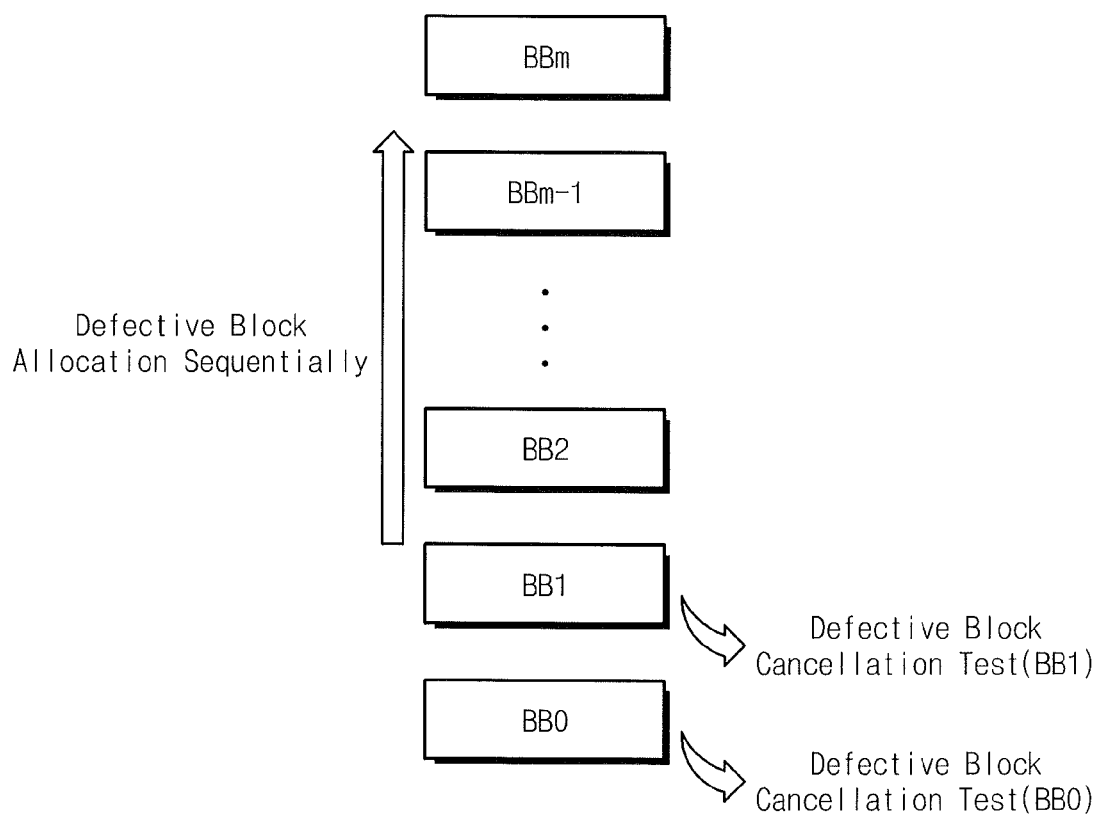
FIG. 2 is a diagram illustrating a method of cancelling a defective block of a memory system according to some embodiments.

Referring now to FIG. 2, a diagram illustrating methods of cancelling a defective block of a memory system according to some embodiments will be discussed. Referring to FIGS. 1 and 2, methods for cancelling a defective block will be discussed. The method may be implemented to perform a defective block cancellation test operation on a defective block BB0 allocated as a defective block for the first time whenever m (m is a natural number) defective blocks are allocated.

As the usage time of the memory system 10 passes, allocations are successively performed from a first defective block BB0 to an m-th defective block BBm-1. If the m-th defective block BBm-1 is allocated, the defective block cancellation unit 142 may perform a defective block cancellation operation on the first defective block BB0. In these embodiments, the defective block cancellation operation may be a program or delete operation performed on the first defective block BB0.

If the program or delete operation is successfully performed on the first defective block BB0, the first defective block BB0 may be cancelled from a defective block. Thus, the first defective block BB0 may become one of the user block 122 or the reserved block 124 shown in FIG. 1. On the other hand, the memory array 12 may be configured to perform a program or delete operation on the defective block 126 in the defective block cancellation test operation.

If the program or delete operation on the first defective block BB0 fails, the first defective block BB0 may be maintained as a defective block. Thereafter, if m+1 defective block BBm is newly allocated, the defective block cancellation unit 142 may perform a defective block cancellation operation on the second defective block BB1. In these embodiments, the defective block cancellation operation of the second defective block BB1 may be performed using a similar method as that of the first defective block BB0 discussed above.

The method discussed with respect to FIG. 2 is based on an oxide recovery. Generally, a degraded oxide may be recovered according to the lapse of time. This means that even a memory block allocated as a defective block may become a usable memory block according to the lapse of time. Accordingly, the memory system 10 may be implemented to perform a defective block cancellation operation at a certain time after a memory block is allocated as a defective block.

The memory system 10 may use various methods to accelerate the oxide recovery. First, an operation of programming memory cells of the erase state (threshold voltage<0V) into cells of the program state (threshold voltage>0V) may be performed on a corresponding memory block before the memory block is allocated as a defective block. Second, a heat treatment operation may be performed on a corresponding memory block before the memory block is allocated as a defective block. In these embodiments, the heat treatment operation may be selectively performed only on a defective block to be allocated.

Figure 3:
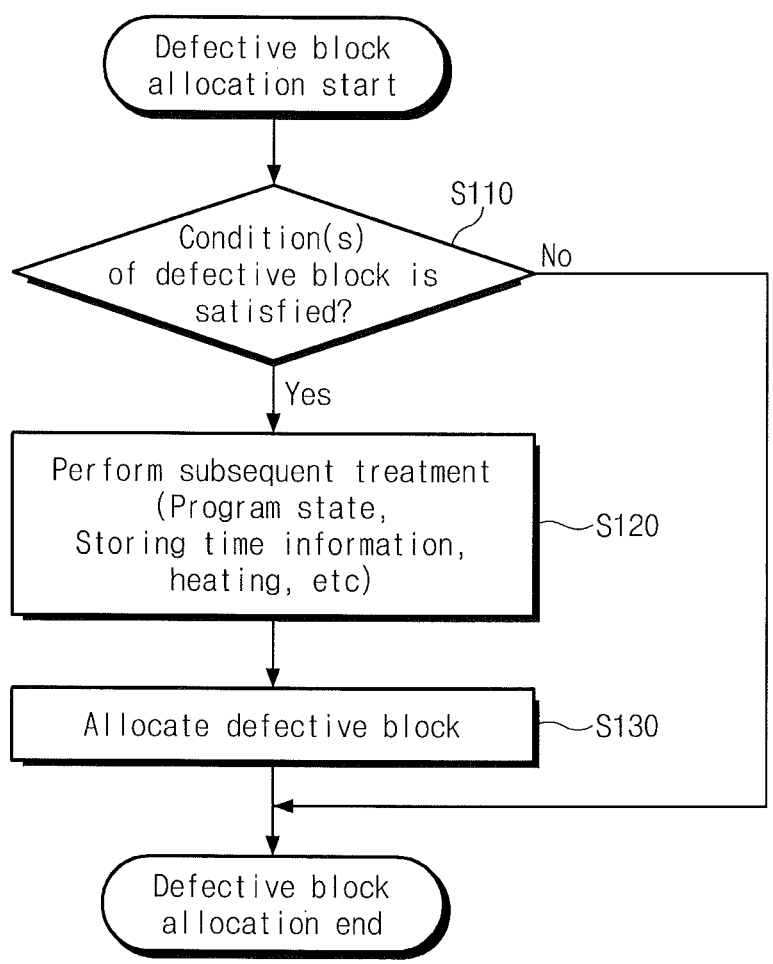
FIG. 3 is a flowchart illustrating methods of allocating a defective block of a memory system according to some embodiments.

Referring now to FIG. 3, a flowchart illustrating a method of allocating a defective block of a memory system according to some embodiments will be discussed. Methods according to some embodiments will be discussed with respect to FIGS. 1 through 3. Operations begin at block S110 by determining at a defective block management unit 14 whether or not a memory block that is being used in a memory system 10 satisfies a defective block condition. For example, the defective block condition may include whether or not the frequency of the program/delete operation of the memory block exceeds a certain frequency/threshold in a write operation or whether or not a delete operation of the memory block fails.

If the defective block condition is not satisfied (block S110), the defective block allocation ends. On the other hand, if the defective block condition is satisfied (block S110), a subsequent treatment is performed on the corresponding memory block (block S120). The subsequent treatment may include operations for facilitating the defective block cancellation. For example, the subsequent treatment may include a program operation, a time information storage, or a heat treatment operation. The program operation and heat treatment operation may be operations for accelerating the oxide recovery. In these embodiments, the stored time information may be used as information for determining a time point of performing the later defective block cancellation operation.

On the other hand, a counter may be used to store the time information. For example, whenever a new defective block is allocated, the count value of the counter may increase. Thus, it may be determined whether or not a certain time has passed after the defective block is allocated, using the count value corresponding to the defective block. For example, a defective block corresponding to a smaller count value may be a defective block that has earlier been allocated than a defective block corresponding to a smaller count value. If the count value exceeds a certain value, a defective block cancellation operation may be performed on the corresponding defective block. In some embodiments, the defective block corresponding to a smaller count value may be a defective block that is later allocated than the defective block corresponding to a greater count value.

After the subsequent treatment, the defective block management unit 14 may allocate a memory block to a defective block (block S130). Information on such an allocation may be stored in a meta block 128 of a memory array.

As discussed above, the memory system 10 may be implemented to perform a heat treatment operation as a subsequent treatment upon defective block allocation. The memory system 10 may be implemented to include a heating unit for performing the heat treatment operation.

Figure 4:
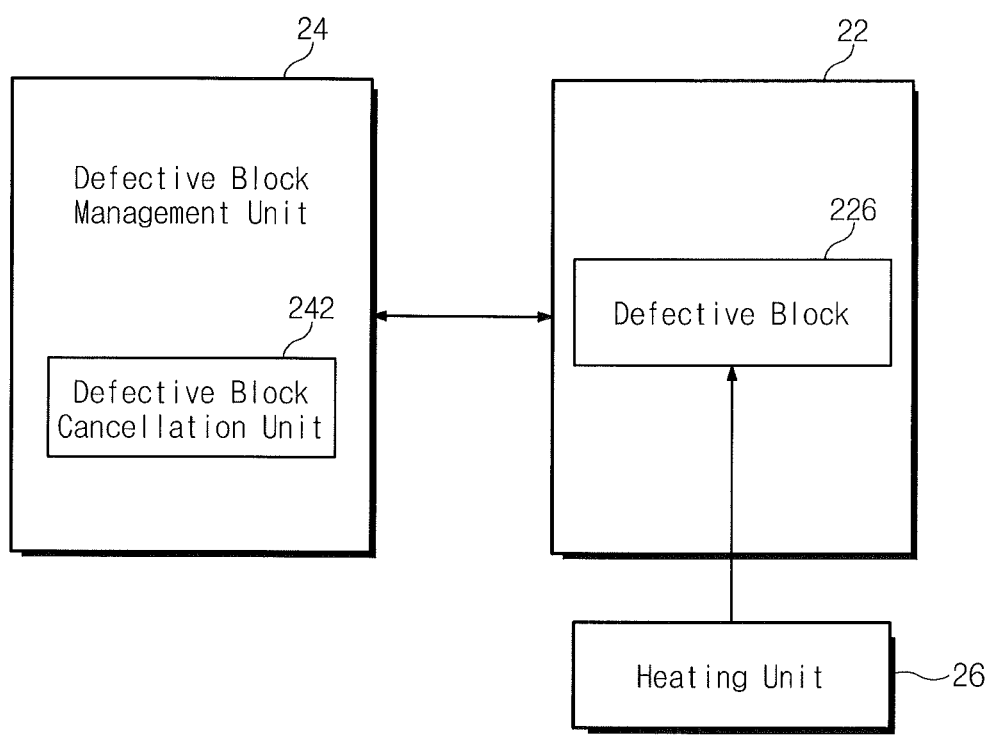
FIG. 4 is a block diagram illustrating a memory system according to some embodiments.

Referring now to FIG. 4, a block diagram illustrating a memory system according to some embodiments will be discussed. Referring now to FIG. 4, a memory system 40 may include a memory array 22, a defective block management unit 24, and a heating unit 26. The memory array 22 and the defective block management unit 24 may perform the same functions as the memory array 12 and the defective block management unit 14 discussed with respect to FIG. 1, respectively. The memory system 20 may include the heating unit 26 for selectively heating a memory block to be allocated to a defective block. The heating unit 26 may be implemented to heat a substrate of the memory block to be allocated. For this, a hot wire or a heat-generating material may be buried in every substrate of the memory blocks.

Figure 5:
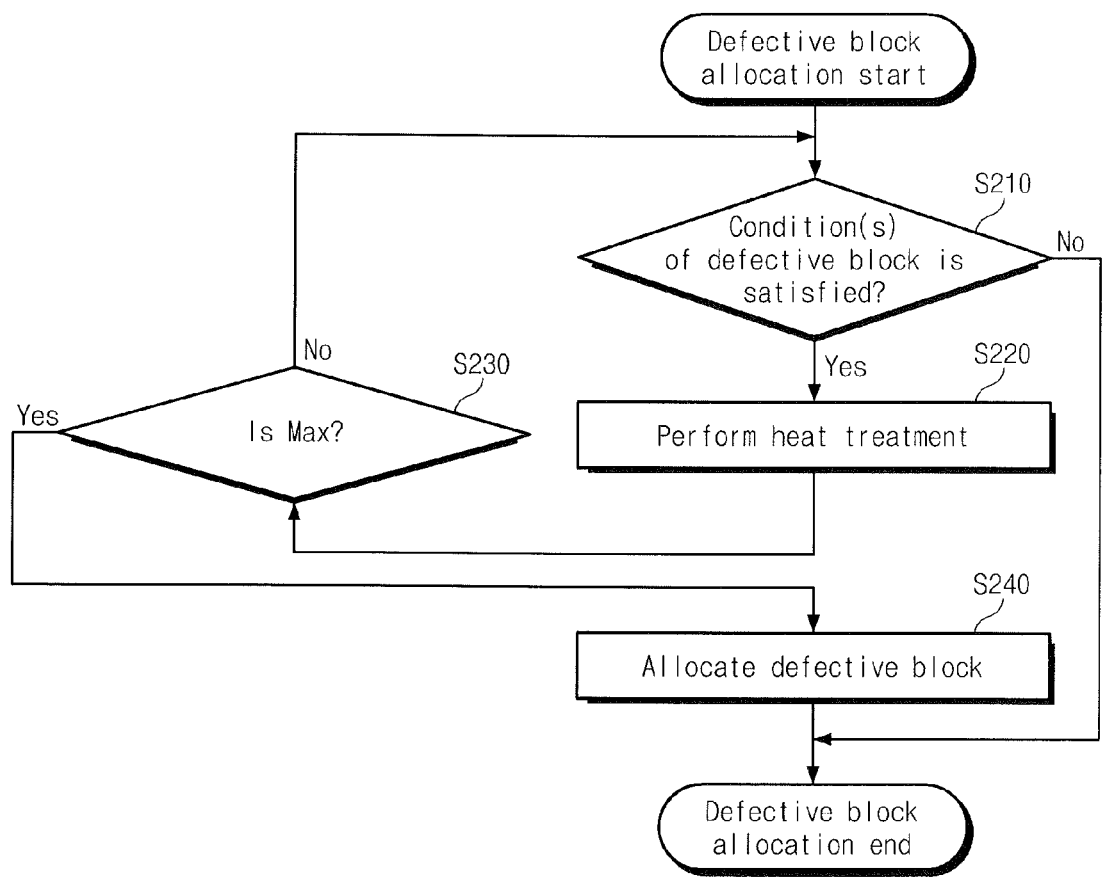
FIG. 5 is a flowchart illustrating methods of allocating a defective block of the memory system of FIG. 4.

Referring to FIG. 5, a flowchart illustrating a method of allocating a defective block of the memory system of FIG. 4 will be discussed. Details with respect to the method will be discussed with reference to FIGS. 4 and 5. Operations begin at block S210 by determining using a defective block management unit 24 whether a memory block to be used satisfies a defective block condition. If the defective block condition is not satisfied (block S210), the defective block allocation ends. On the other hand, if the defective block condition is satisfied (block S210), a heat treatment operation may be performed on the memory block (block S220). The heat treatment operation may be repeatedly performed in some embodiments. The frequency of the heat treatment operations may be determined (block S230). If the frequency of the heat treatment operations is greater than a certain frequency (block S230), the memory block may be finally allocated as a defective block (block S240). On the other hand, the heat treatment operation does not exceed the certain frequency, operation proceed to block 5210 and repeat.

The memory system 20 can perform the heat treatment operation through the defective block allocation method describe above, thereby improving the efficiency of the memory block.

Figure 6:
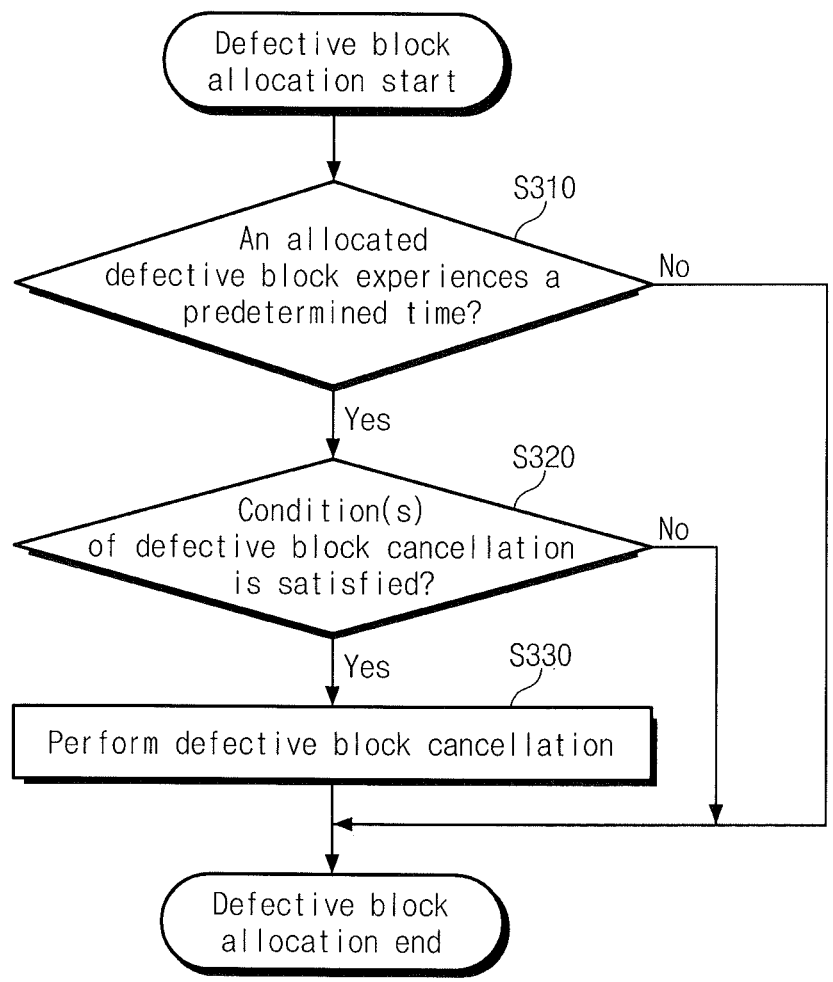
FIG. 6 is a flowchart illustrating methods of cancelling a defective block of a memory system according to some embodiments.

Referring now to FIG. 6, a flowchart illustrating a method of cancelling a defective block of a memory system according to some embodiments will be discussed. As illustrated in FIG. 6, the defective block cancellation method may be performed as follows. For convenience of explanation, the memory system 10 described in FIG. 1 will be exemplified.

Operations begin at block S310 using the defective block cancellation unit 142 to determine whether or not a certain time has passed after a defective block is allocated. If the certain time has not passed (block S310), the defective block cancellation may end. On the other hand, if the certain time has passed (block S310), the defective block cancellation unit 142 may determine whether or not the allocated defective block satisfies a defective block cancellation condition (block S320). In these embodiments, the defective block cancellation condition may include whether or not a program or delete operation on the defective block is successful.

If the defective block cancellation condition is not satisfied (block S320), the defective block cancellation may end. On the other hand, the defective block cancellation condition is satisfied, the allocated defective block may be cancelled (block S330). In these embodiments, when the defective block is cancelled, the defective block may be allocated as the user block 122 or the reserved block 124, and the frequency of the program/delete of the corresponding memory block may be initialized or lowered to a value reduced by a certain frequency.

On the other hand, when the defective block is cancelled, the cancelled memory block may be configured to be usable in an optimum mode. That is, when the defective block is cancelled, the number of bits per cell may be adjustable in the cancelled memory block. For convenience of explanation, it will be assumed that the memory system 10 includes a memory array 12 of multi-level cells of at least 3-bit. In these embodiments, the memory block cancelled from the defective block may be configured to be at least one of a Single Level Cell (SLC), a 2-bit multi-level cell, or an at least 3-bit Multi-Level Cell (MLC). For example, if the degree of the oxide recovery is slight in the defective block cancellation, the cancelled memory block may be used as an SLC or a 2-bit multi-level cell. On the other hand, if the degree of the oxide recovery is great, the cancelled memory block may be used as an at least 3-bit MLC. The degree of the oxide recovery may be determined by external test equipment.

Figure 7:
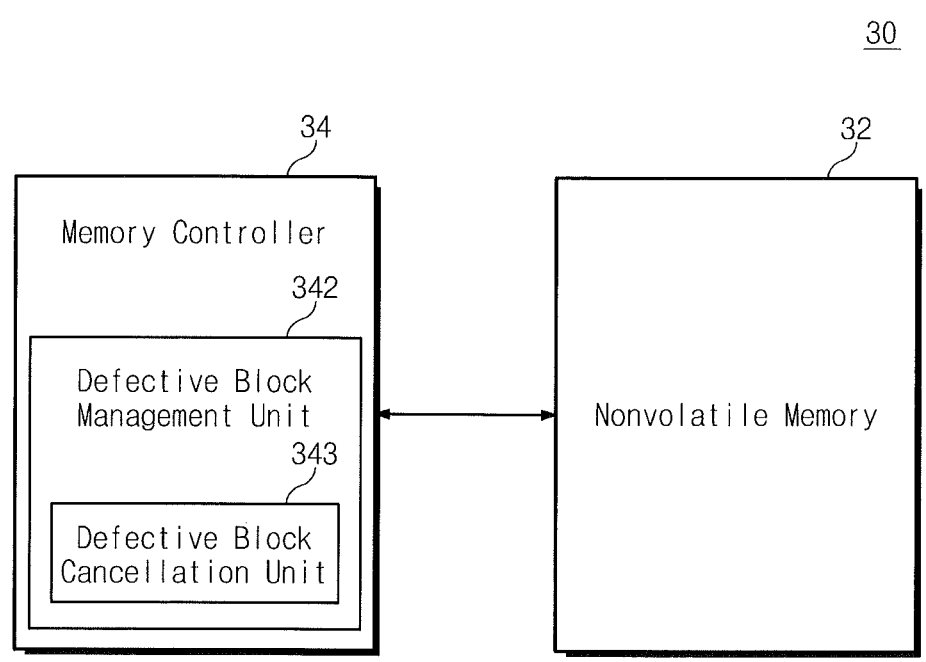
FIG. 7 is a diagram illustrating a memory system according to some embodiments.

Referring now to FIG. 7, a diagram illustrating a memory system according to some embodiment will be discussed. As illustrated in FIG. 7, a memory system 30 may include a non-volatile memory 32 and a memory controller 34 for controlling the same.

The non-volatile memory 32 may include a NAND flash memory, a NOR flash memory, a Phase-change RAM (PRAM), and a Magnetoresistive RAM (MRAM) without departing from the scope of the present application. The non-volatile memory 32 may include a configuration similar to the memory array 12 shown in FIG. 1 or the memory array 22 shown in FIG. 4.

The memory controller 34 may include a defective block management unit 342. In these embodiments, the defective block management unit 342 may include a defective block cancellation unit 343 for cancelling an allocated defective block. The defective block management unit 342 may be implemented in the same manner as the defective block management unit 14 shown in FIG. 1 or the defective block management unit 24 shown in FIG. 4.

Figure 8:
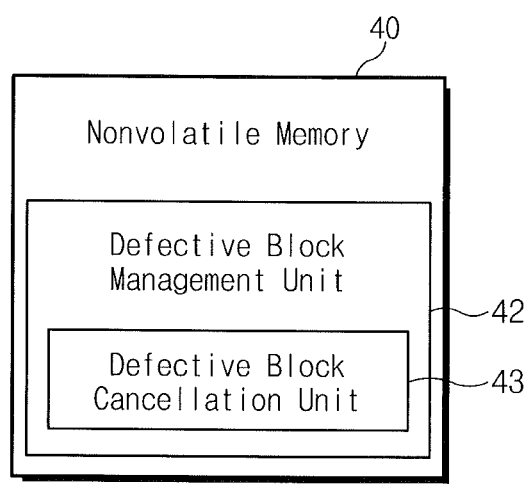
FIG. 8 is a block diagram illustrating a non-volatile memory device according to some embodiments.

Referring now to FIG. 8, a block diagram illustrating a non-volatile memory device according to some embodiments will be discussed. As illustrated in FIG. 8, a non-volatile memory 40 may include a defective block management unit 42 having a defective block cancellation unit 43 for cancelling a defective block. In these embodiments, the defective block management unit 42 may be implemented in the same manner as the defective block management unit 14 shown in FIG. 1 or the defective block management unit 24 shown in FIG. 4.

Figure 9:
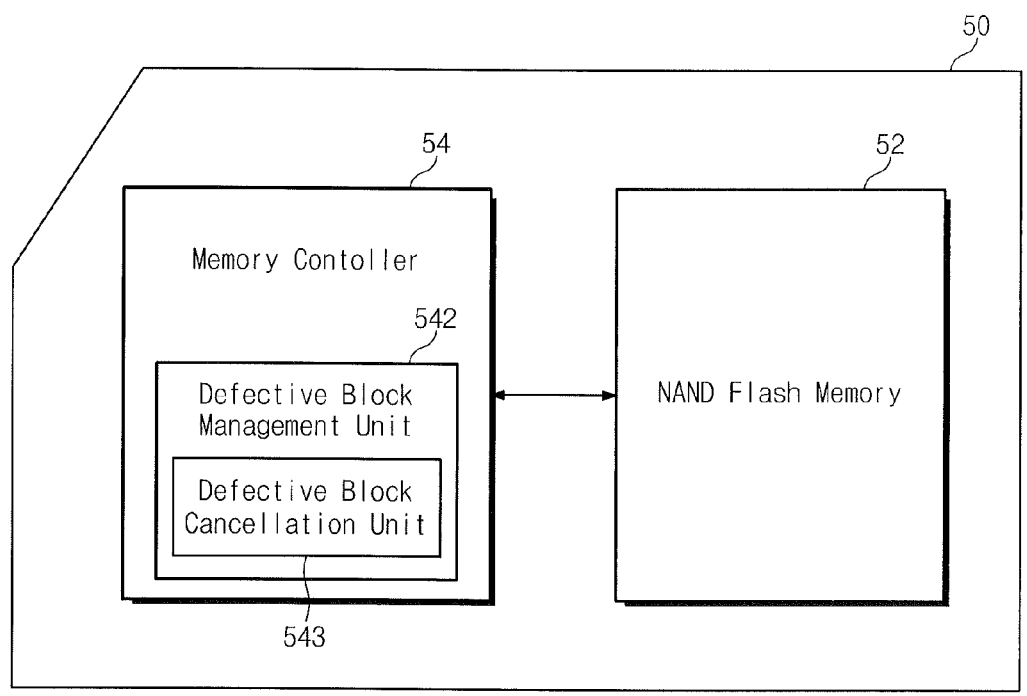
FIG. 9 is a diagram illustrating a memory card according to some embodiments.

Referring now to FIG. 9, a diagram illustrating a memory card according to some embodiments will be discussed. As illustrated in FIG. 9, a memory cad 50 may include a NAND flash memory 52 and a memory controller 54 for controlling the same.

The memory controller 54 may include a defective block management unit 542 having a defective block cancellation unit 543 for cancelling a defective block. In these embodiments, the defective block management unit 542 may be implemented in the same manner as the defective block management unit 14 shown in FIG. 1 or the defective block management unit 24 shown in FIG. 4. The memory cad 50 may be applied to a Multimedia Card (MMC) or a Secure Digital (SD) card.

The memory systems according to some embodiments may be applied to, for example, a Sold State Drive (SSD).

Figure 10:
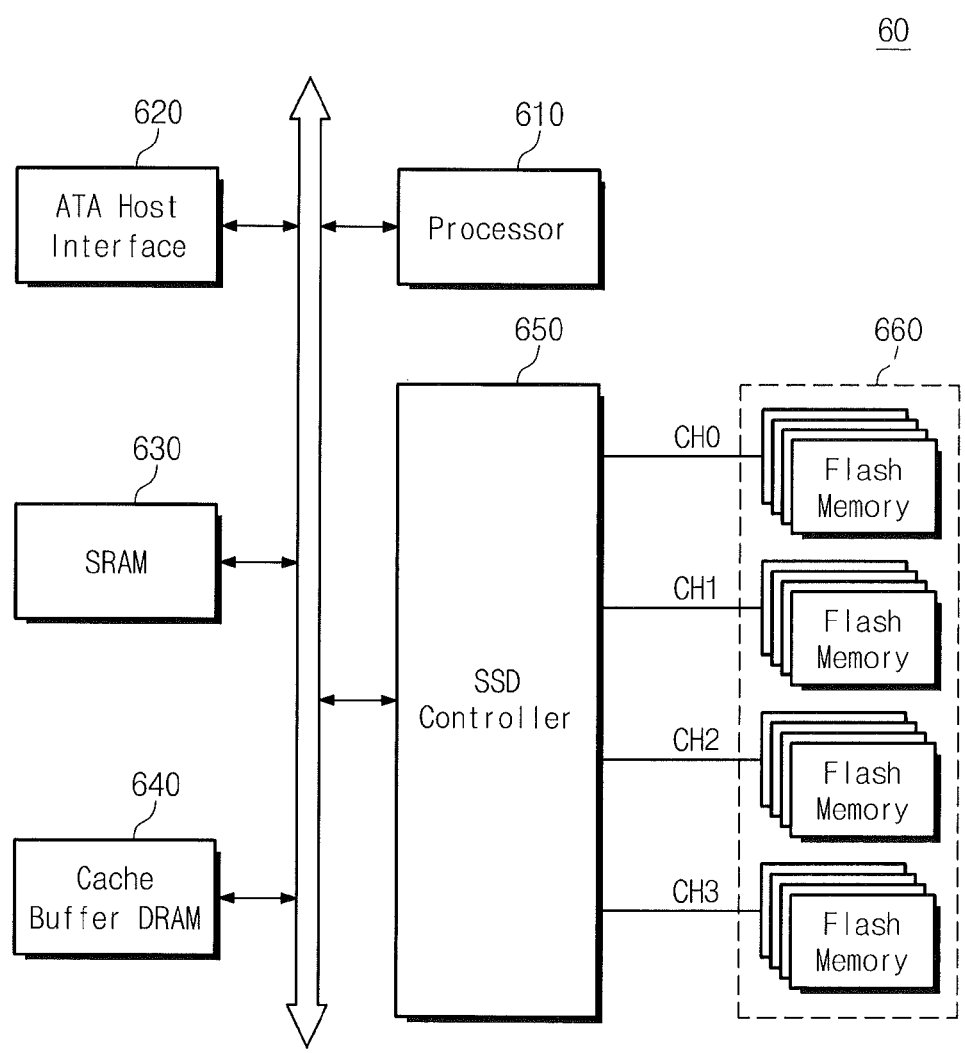
FIG. 10 is a block diagram illustrating a Solid State Drive (SSD) applied with a memory system according to some embodiments.

Referring now to FIG. 10, a block diagram illustrating an SSD applied with a memory system according to some embodiments will be discussed. As illustrated in FIG. 10, an SSD 60 may include an SSD controller 650 and a plurality of flash memories 660. The SSD controller 650 may be implemented to have a similar function as the memory controller 24 shown in FIG. 7.

Referring again to FIG. 10, a processor 610 may determine and control whether to store data from a host in a flash memory or to send data stored in the flash memory to the host according to commands from the host.

An ATA host interface 620 may exchange data with the host according to the control of the above processor 610. The ATA host interface 620 may fetch commands and addressed from the host and deliver the command and addresses to the processor 610 through a CPU bus. In these embodiments, the ATA host interface 620 may be one of an SATA interface, a PATA interface, and an ESATA (External SATA) interface.

Data input from the host through the ATA host interface 620 or transmitted to the host may be delivered through a cache buffer RAM 640, not via the CPU bus according to the control of the processor 610.

A RAM 630 may be used to temporarily store data necessary for the operation of the flash memory system 60. The RAM, which is a volatile memory, may include a DRAM or an SRAM.

The cache buffer RAM 640 may temporarily store exchange data between the host and the flash memories 660. Furthermore, the cache buffer RAM 640 may also be used to store a program to be operated by the processor 610. The cache buffer RAM 640 may be considered as a sort of a buffer memory, and may be implemented using an SRAM.

The SSD controller 650 may exchange data with the flash memories 660 that are used as storage devices. The SSD controller 650 may be configured to support NAND flash memories, one-NAND flash memories, multi level flash memories, and single level flash memories. On the other hand, the processor 610 and the SSD controller 650 may be implemented using a single ARM processor.

The memory systems applied with an address allocation method of a Flash Translation Layer (FTL) according to some embodiments can significantly reduce the write speed when powered off. Thus, when power is cut off, data in a working RAM may be safely backed up into a flash memory. As a result, data stability can be improved when the memory system is powered off.

The memory systems according to some embodiments can be used as mobile storage devices. Accordingly, the memory systems can be used as storage devices of MP3s, digital cameras, e-books, digital TVs, and computers.

The memory systems or storage devices according to some embodiments may be mounted in various forms of packages. For example, the memory systems or storage devices may be mounted in packages such as Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

In a memory system according to some embodiments, even an allocated defective block can be cancelled if satisfying a defective block cancellation condition, thereby improving the efficiency of a memory block Example embodiments are described above with reference to block diagrams and/or flowchart illustrations of systems and/or computer program products. It is understood that a block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means (functionality) and/or structure for implementing the functions/acts specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the functions/acts specified in the block diagrams and/or flowchart block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the block diagrams and/or flowchart block or blocks.

Accordingly, example embodiments may be implemented in hardware and/or in software (including firmware, resident software, micro-code, etc.). Furthermore, example embodiments may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), and a portable compact disc read-only memory (CD-ROM).

Computer program code for carrying out operations of data processing systems discussed herein may be written in a high-level programming language, such as Java, AJAX (Asynchronous JavaScript), C, and/or C++, for development convenience. In addition, computer program code for carrying out operations of example embodiments may also be written in other programming languages, such as, but not limited to, interpreted languages. Some modules or routines may be written in assembly language or even micro-code to enhance performance and/or memory usage. However, embodiments are not limited to a particular programming language. It will be further appreciated that the functionality of any or all of the program modules may also be implemented using discrete hardware components, one or more application specific integrated circuits (ASICs), or a programmed digital signal processor or microcontroller.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method for managing a defective block in a memory device, comprising:
    allocating a defective block when a memory block satisfies at least one defective block condition, wherein allocating of the defective block comprises:
        determining whether the memory block satisfies the defective block condition;

performing a subsequent treatment on the memory block when the memory block satisfies the defective block condition;

allocating the memory block as a defective block; and cancelling the allocated defective block when the allocated defective block satisfies at least one defective block cancellation condition, wherein the at least one defective block cancellation condition includes a number of program/erase cycles or a failure of a program/erase operation during the program/erase operation of the memory device;

wherein the defective block cancellation condition includes whether or not a program/erase operation on the defective block is successful; and wherein the subsequent treatment is used to accelerate oxide recovery of memory cells in the defective block.

2. The method of claim 1, wherein the subsequent treatment comprises programming a cell of an erase state into a cell of a program state.

3. The method of claim 1, wherein the subsequent treatment comprises storing a time point when the memory block is allocated as a defective block.

4. The method of claim 1, wherein the subsequent treatment comprises performing a heat treatment on the memory block.

5. The method of claim 4, wherein the heat treatment is performed by a heating device of the memory device.

6. The method of claim 1, wherein the defective block condition comprises a frequency of program or delete cycles or whether a delete operation fails.

7. The method of claim 1, wherein cancelling of the defective block comprises:

determining whether the allocated defective block has passed a certain time;

determining whether the defective block having passed the certain time satisfies the defective block cancellation condition; and cancelling the allocated defective block when the allocated defective block satisfies the defective block cancellation condition.

8. The method of claim 7, wherein determining whether the allocated defective block has passed a certain time further comprises increasing or reducing a count value corresponding to the allocated defective block whenever a new defective block is allocated.

9. The method of claim 7, wherein the defective block cancellation condition comprises whether a program or delete operation is performed on the allocated defective block.

10. The method of claim 7, further comprising initializing or reducing a frequency of program or delete operations of the corresponding memory block when the allocated defective block is cancelled.

11. The method of claim 7, further comprising adjusting number of bits per cell of the corresponding memory block when the allocated defective block is cancelled.

12. A memory system comprising:

a plurality of memory blocks; and a defective block management unit configured to:

manage a defective block of the plurality of memory blocks, wherein managing the defect block includes performing a treatment on one of the plurality of memory blocks when the one of the plurality of memory block satisfies a defective block condition;

wherein the defective block management unit comprises at least one defective block cancellation unit for cancelling an allocated defective block when the allocated defective block satisfies at least one defective block cancellation condition;

wherein the at least one defective block cancellation condition includes a number of program/erase cycles or a failure of a program/erase operation during the program/erase operation of the memory device;

wherein the at least one defective block cancellation condition includes whether or not a program/erase operation on the defective block is successful; and wherein the subsequent treatment is used to accelerate oxide recovery of memory cells in the defective block.

* * * * *